United States Patent Office 3,682,635

Patented Aug. 8, 1972

3,682,635

MANUFACTURE OF COLOURED COLLOID PATTERNS

Jan Frans Van Besauw, Brasschaat, and Albert Lucien Poot, Kontich, Belgium, assignors to Gevaert-Agfa N.V., Mortsel, Belgium No Drawing. Filed June 30, 1970, Ser. No. 51,336
Int. Cl. G03c 5/00, 1/58
U.S. Cl. 96—35 26 Claims

ABSTRACT OF THE DISCLOSURE

Coloured colloid patterns are produced by imagewise exposing a hydrophilic coloured colloid layer containing a diazonium compound and treating the exposed colloid layer with an alkaline substance that in conjunction with the diazonium salt left in the unexposed portions of the layer effects a selective hardening of the colloid layer in the unexposed portions.

For a multicolour print, plural hydrophilic differently coloured colloid layers containing said diazonium compound are used, each layer being transferred successively from a temporary support to a common permanent support, exposed in registration, treated after its transfer and exposure with the alkaline substance, and washed to remove the exposed non-hardened portions of each differently colored colloid layer, thereby building up a multicolor print.

The present invention relates to a recording and reproduction process for producing coloured colloid patterns corresponding with information-wise modulated electromagnetic radiation. The present invention more particularly relates to a process for producing direct positive halftone and line-work multicolour polymeric images and to materials used therefor.

The production of halftone colour images is of interest in the field of design, e.g. in the production of colour decorative patterns, colour wiring and circuit diagrams, cartography, colour proofing and in the production of transparencies for dia- or overhead-projection.

Especially in the colour field of the graphic art there is a great need for a simple and fast technique offering "colour proofs" of high quality and reproducibility.

Colour proofing materials serve to produce a showing proof for submission to the printer and his client to give an idea of a multicolour halftone reproduction as will be produced by the successive printing in register with the separate standard inks: yellow, magenta, cyan, and black.

The colour proof makes it possible to determine whether corrections have to be made to the separation halftone transparencies with the aid of which the printing masters have to be produced.

Known colour proofing systems can be divided into two classes viz. those producing positive copies of the image to be printed starting from halftone separation negatives (negatively working colour proofing) and those producing positive copies of the image to be printed starting from halftone separation positives (positively working colour proofing).

Whether negative or positive halftone separation transparencies have to be used in the production of a printing form, depends on the photochemical properties (photohardening or photosolubilization) of the photoresist coating and the type of processing to yield a positive printing master.

According to known photo-hardening processes coloured hardened colloid patterns corresponding with electromagnetic radiation patterns are produced and developed to relief patterns by means of an aqueous liquid using a non-light sensitive hydrophilic colloid or polymer, which is insolubilized or cross-linked by means of a compound that is produced by irradiation of a photosensitive compound. So e.g. dichromated hydrophilic colloid layers e.g. layers containing dichromated gelatin or gum arabic (ref. P. Glafkidès, Photographic Chemistry, Fountain Press—London—vol. II (1960), p. 669–674) are used in so-called negatively working colour proofing operating with negative halftone separation transparencies.

In the photographic colour proofing technique described in the United Kingdom patent specification 879,049 a positive working colour film is applied which is based on image-wise colour coupler diffusion. The processed films may be used singly or in overlays.

The use of images in overlay offers a less good imitation of the final printing results since the monocolour halftone transparencies must be laid in register and inspected diascopically or against an opaque background. Further as is generally known diffusion processes cannot guarantee a very high image sharpness for always a lateral diffusion of the transferred compounds takes place.

It is one of the objects of the present invention to provide a recording and reproduction process suited for the production of coloured colloid patterns having the same image values as the original applied in the exposure. Thus, the present invention is especially useful for producing positive monocolour copies of positive originals.

It is another object of the present invention to provide multicolour proofs built up in an economic, highly reproducible and easy way by coloured colloid reliefs superposed on one and the same permanent support.

In the present invention the production of photosensitive coloured positive colloid reliefs is based on the use of a diazonium compound that in combination with a basic compound effects a hardening of a hydrophilic colloid containing active hydrogen atoms as is the case e.g. with hydrophilic colloids of the protein class.

The process of the present invention for producing a colloid pattern comprises the steps of:

(1) Information-wise exposing a hydrophilic colloid layer containing a photosensitive diazonium salt to electromagnetic radiation capable of decomposing the diazonium compound which hydrophilic colloid layer contains a hydrophilic colloid that is capable of undergoing a decrease in water-solubility by an alkaline treatment in the presence of the unexposed diazonium salt, (2) Treating the information-wise exposed colloid layer with (an) alkaline substance(s) that in conjunction with the diazonium salt left in the unexposed portions of the recording layer effect(s) a selective hardening of the colloid layer in the unexposed portions, and (3) Removing the exposed portions of the colloid layer by means of a wash-off treatment leaving a relief pattern corresponding with the non-exposed portions of the colloid layer.

According to a preferred embodiment of the present invention for producting multicolour patterns coloured electromagnetic radiation-sensitive hydrophilic colloid layers are used on a temporary support. The coating composition contains already in the coating stage (a) diffusion resistant colouring substance(s) and (a) relatively stable (in comparison with dichromated gelatin) radiation-sensitive diazonium compound(s) in a desired amount. In other words no colouring or light-sensitive ingredients are introduced by diffusion or imbibition, which is difficult to control and yields less reproducible results. Moreover, the exposure of the colloid layers can proceed in substantially dry state, which excludes chemical attack of the exposure apparatus and offers a real advantage to the operating personnel.

According to a characterizing aspect of the said preferred embodiment of the present invention superposed multilayer coloured colloid patterns are produced by transfer of the non-exposed coloured colloid layers to a same permanent support wherein each of the transferred colloid layers after its imagewise exposure in register to active electromagnetic radiation is hardened in the non-exposed areas by means of an aqueous hardening treatment, as a result of which the hardened colloid portions become anchored to underlying colloid portions or parts of an underlying colloid-containing layer e.g. a hydrophilic subbing layer. Any possible frilling off of the coloured colliod coating during wash-off development, which is so common a difficulty in processes involving a wash-off treatment of transferred colloid coatings, is overcome in this way.

According to another aspect of said preferred embodiment of the present invention, which relates to the production of high-quality multi-colour images, differently coloured electromagnetic radiation-sensitive hydrophilic colloid layers are transferred in wet state from a temporary support to a single permanent support, which—when used in colour proofing—is preferably an opaque hydrophilic or hydrophilized support resembling the printing stock as much as possible. Each transferred colloid layer is exposed separately in register on the single permanent support through a properly selected separation positive while directing the exposed colloid layer to the radiation source during the exposure.

The production of multicolour proofs built up by superposed coloured colloid relief patterns proceeds preferably by a process containing the steps of:

(1) Transferring a coloured hydrophilic colloid layer, which contains said diazonium compound and said hydrophilic colloid from a temporary support, which is relatively hydrophobic in respect of a permanent support, to which said layer has to be transferred, to said permanent support by pressing it in the presence of an aqueous liquid (in other words in moist or dampened state) against said colloid layer, and removing the temporary support, thus leaving the said layer on the permanent support, (2) Exposing the transferred colloid layer in substantially dry state to information-wise modulated electromagnetic radiation that decomposes the diazonium compound, (3) Treating the exposed colloid layer with ammonia or an organic amine in the presence of water, till hardening of the non-exposed colloid layer portions, (4) Removing the exposed portions of the colloid layer by washing-off, and (5) Repeating the steps (1), (2), (3) and (4) with said hydrophilic colloid layers having an arbitrary colour and transferring them on the same permanent support in superposition to the already formed colloid relief pattern(s).

Diazo compounds which are illustrative of the type suitable for practising the invention are derived from 1,2- and 2,1-amino naphthols, 1,4-amino naphthols and aromatic p-diamines of the benzene series, particularly phenylenediamines which are mono- or disubstituted at one of the two amino groups. These light-sensitive diazo compounds are commonly used in the production of diazotype images Suitable diazo compounds are:

p-diazo-diphenylamine sulphate
p-diazo-dimethylaniline chloride·zinc chloride
p-diazo-diethylaniline chloride·zinc chloride
p-diazo-ethyl-hydroxyethyl aniline chloride·½ zinc chloride
p-diazo-methyl-hydroxyethyl aniline chloride·½ zinc chloride
p-diazo-2,5-diethoxy-benzoylaniline chloride·½ zinc chloride
p-diazo-ethyl-benzyl aniline chloride·½ zinc chloride
p-diazo-dimethylaniline borofluoride
p-diazo-2,5-dibutoxy-benzoylaniline chloride·½ zinc chloride
p-diazo-1-morpholinobenzene chloride·½ zinc chloride
p-diazo-2,5-dimethoxy-1-p-toluyl-percaptobenze chloride·½ zinc chloride
p-diazo-3-ethoxy-diethylaniline chloride·½ zinc chloride
2,5,4'-triethoxy-diphenyl-4-diazonium oxalate
p-diazo diethyl aniline chloride·½ zinc chloride
p-diazo-2,5-dibutoxy-1-morpholino-benzene chloride·zinc chloride
p-diazo-2,5-dimethoxy-1-morpholino-benzene chloride·zinc chloride
p-diazo-2,5-diethoxy-1-morpholino-benzene chloride·zinc chloride
p-diazo-2-chloro-diethylaminobenzene chloride·½ zinc chloride
p-diazo diethyl aniline borofluoride
p-diazo-2-chloro-acetylaniline chloride·½ zinc chloride
p-diazo-2-methyl diethylaminobenzene chloride·zinc chloride
p-diazo-2-methyl-ethylaminobenzene chloride
p-diazo-3-methyl-diethylaminobenzene chloride·½ zinc chloride
p-diazo-3,5-dimethyl-dimethylaminobenzene·½ zinc chloride The preferred diazo compounds are employed in the form of their stabilized salts, as exemplified by p-diphenylamine diazonium sulphate or in the form of their zinc chloride or boron trifluoride double salts.

The selectivity of hardening of the colloid layer increases with rising concentrations of photosensitive diazonium compound. The amount of diazonium compound that can be incorporated is limited by the concentration at which crystallisation of said compound in the colloid layer starts. Consequently, preferably the best water-soluble diazonium compounds are used or mixtures of these compounds that do not so easily crystallize. Preferably the photosensitive coloured colloid layer contains 15 to 40% by weight of the diazonium compound calculated on the weight of the dry hydrophilic colloid(s), preferably gelatin.

The alkaline substance which in conjunction with the diazonium salt effects the hardening of the hydrophilic colloid is preferably applied in an amount high enough to raise the pH of the colloid layer above 8. The alkaline substance is e.g. an inorganic base such as sodium hydroxide, or ammonium hydroxide or an organic "onium" hydroxide compound e.g. derived from an organic amino compound e.g. an aliphatic, alicyclic or heterocyclic amine. Preferred amines are ethanolamine, diethanolamine, triethanolamine, cyclohexylamine, dicyclohexylamine, dimethylenetriamine having the formula:

$$H_2N—CH_2—NH—CH_2—NH_2$$

urotropine and morpholine. The alkaline substances may be applied from a solution in water or a mixture of water and a water-miscible organic solvent.

According to a special embodiment the hardening of the unexposed portions proceeds with a volatile base or alkaline compound in vapour phase e.g. ammonia, plus water vapour as is done in the so-called "dry development" of the diazotype process. Thus, for that purpose a common diazotype apparatus can be used for successively performing the two operations of exposure and development by transporting the original and the photosensitive material in superposed relation e.g. with the help of an endless belt conveyor through separate exposure and development compartments.

The ammonia vapour treatment normally results not only in a selective hardening but yields also some undesirable background colouration (stain) which may be removed by means of a treatment with a reducing agent. Suitable reducing agents for that purpose are e.g. sodium hydrosulphite, stannous chloride and hypophosphorous acid that are preferably applied from an aqueous solution.

The aqueous liquid supplying the alkaline substance (hereinafter called the activator liquid) producing in conjunction with the unexposed diazonium compound the desired hardening of the unexposed portions of the colloid layer preferably contains a water-miscible solvent improving the selective washing off of the non-hardened portions of the hydrophilic colloid recording layer. In order to speed up the selective hardening some of the activating compositions e.g. those containing organic amines are applied in warm state e.g. at a temperature of 35 to 65° C.

The alkaline activating liquid may contain a hardening agent for gelatin e.g. formaldehyde or bis-hydroxymethyl urea in an amount of 1 to 3 grams per liter.

The choice of aldehyde hardener depends on the selectiveness of hardening between exposed and unexposed portions of the photosensitive coating and the effectiveness and speed of hardening desired with respect to a selected aldehyde hardenable protein colloid.

So, other suitable hardening agents are e.g. glyoxal, glutardialdehyde and mucochloric acid.

The use of an organic water-miscible solvent in the activator liquid restrains the swelling of the unexposed portions of the colloid layer in the wash-off step. Organic solvents suited for that purpose are water-miscible alkanols and ketones e.g. methanol, ethanol, isopropanol and acetone. The same effect can be obtained by the use of electrolytes that are known for precipitating (flocculating) gelatin from its aqueous solution e.g. a compound yielding sulphate ions e.g. ammonium sulphate, sodium sulphate and other electrolytes known for that purpose.

For solvent precipitation and electrolyte precipitation of gelatin reference is made e.g. to Photographic Emulsion Chemistry by G. F. Duffin—The Focal Press, London and New York (1966), pp. 78–80.

The concentration of inorganic base e.g. ammonium hydroxide and/or organic amines in the activating liquid may vary between 1 and 25% by weight.

After the treatment with the activator liquid which treatment may last from about 30 seconds to about 8 minutes according to the temperature, the concentration and type of activator solution the information-wise exposed portions of the hydrophilic colloid recording layer are washed away selectively with a jet of tap water preferably at 30–50° C.

After the wash-off development the swollen relief portions corresponding with the non-exposed area of the recording layer are deflated in an alkanol-water mixture, preferably an ethanol-water mixture containing from about 80:20 to 70:30 percent by volume of ethanol to water.

Preferably used hardenable hydrophilic colloids are hydrophilic water-soluble colloid polymers containing active hydrogen atoms as are present e.g. in hydroxyl groups and amino groups. Both qualitative characterization and quantitative determination of active hydrogen can be carried out by the procedure known as the Zerewitinoff active hydrogen determination. Hardenable colloids containing active hydrogen atoms are e.g. polyvinyl alcohol, polyacrylamide or gelatin, and other film or stratum-forming proteinaceous colloids.

In the present invention best results are obtained with hardenable hydrophilic water-soluble colloids that possess the property of sol-gel transformation such as gelatin, which offers an easy transfer and good adherence in the technique using a transfer from a temporary to a permanent support. "Sol-gel transformation" is explained by R. J. Croome and F. G. Clegg in Photographic Gelatin—The Focal Press—London (1965), pages 37–39.

The above hydrophilic colloids may be used in admixture with proper latent hardening agents, and cross-linking agents that split off an hardening species on heating e.g. latent polyisocyanates as described in the United Kingdom patent specifications 991,676 and 1,058,425.

In the production of superposed multicolour colloid patterns the dyes used in the photosensitive colloid layers have to be resistant to diffusion and chemically inert in the processing and washing liquid(s) as much as possible. When being used in "colour proofing" they have to match with the absorption spectrum of the standard process inks as close as possible. Particulars about standard colour inks can be found in H. M. Cartwright—Ilford Graphic Arts Manual (1962), vol. I—pages 502 to 504.

There exist "cold" and "warm" colour standards. Cold colour tones are e.g. standardized in the U.S.A. in the GATF-Color Charts and in the German Standards DIN 16508 and 16509. Warm colour tones are standardized e.g. in the German Standard DIN 16538.

The cold colour standards are characterized by the use of fairly pure magenta pigments, mostly insolubilized rhodamine and phloxine-dyes, which have a very low side-absorption in the blue region of the spectrum.

The warm colour standards are characterized by the use of insolubilized azo dyestuffs. Said dyestuffs are more resistant to solvents e.g. alcohol than the rhodamines and phloxines, but they possess a much higher side-absorption in the blue region of the spectrum.

It has been found experimentally that pigments, which are insoluble or very poorly soluble in water, and organic liquids of the alcohol or polyhydric alcohol type e.g. glycerol, fulfill the requirements of resistance to diffusion. Pigment dyes that are applied from an aqueous dispersion are used preferably, though the use of substantive dyes that are chemically linked to a colloid or polymer is not excluded. For colour-proofing purposes the hardenable colloid layer contains pigments in a concentration so high that the optical density in the wavelength range of maximum absorption is at least 0.35.

Apart from the use of dyes, the absorption spectrum of which has to satisfy particular requirements for colour proofing, all colours are considered e.g. cyan, light-cyan, magenta, warm magenta, black, yellow, green, brown, orange, red, white blue as well as metallic colours such as pale gold, rich gold, copper, and silver. In other words the term "colour" in the present invention is meant to encompass all pure and mixed colours as well as black-and-white.

Non-migratory pigments suitable for use in the present invention are known under the name "Pigmosol" and "Colanyl" dyes. "Pigmosol" and "Colanyl" are trademarks of Badische Anilin- & Soda-Fabrik A.G., Ludwigshafen (Rhine), Germany, for organic pigment dyes that are mixed with a dispersing agent for aqueous medium. These pigment dyes excel in resistance to light, heat, acids, bases, oxidizing agents, and solvents. They are insoluble in hydrophilic colloids such as gelatin.

The black pigment for the black-toned part image is preferably carbon black.

Even if the pigments are completely inert in the aqueous processing and washing liquids they may stain to some extent the permanent support at the non-exposed areas as a result of simple adhesion forces. In order to avoid a direct contact of the pigment(s) with the permanent support the pigment coating on the temporary support is over-coated with a hydrophilic colloid layer (top layer), which does not contain pigments or dyes for forming the image. On transfer of such composite coating the top layer comes into contact with the permanent support and is sandwiched between said support and the pigmented coating. The top layer contains the same colloid(s) as the coloured layer and is preferably of the same composition as the pigmented coating except for the presence of the visible image-forming pigment(s) or dyes thereon. The top layer, however, may contain a small amount of translucent pigments, e.g. silica particles, protruding from the layer and being a few microns thicker than the top layer. They avoid sticking of rolled up sheet material at relatively high (e.g. 60%) relative humidity. The top layer contains, e.g., 1 to 1.5 g. of gelatin per sq. m.

In order to obtain images with a good resolution, relatively thin radiation-sensitive coloured colloid coatings are preferred. Preferably they have a thickness in the range of $1\mu$ and $15\mu$. Good results are obtained with coloured colloid layers containing 2 to 10 g. of gelatin per sq. m. Very good results are obtained with coloured layers having a thickness of 4 to $5\mu$ and containing 2.5 to 3 g. of gelatin per sq. m. The colloid layers preferably contain at least 50% by weight of gelatin.

The adhering power of the transferable coating to its temporary support, preferably a flexible one, has to be adjusted in such a way that an easy stripping off from the temporary support is possible after pressing the pigment coating into contact with the permanent support. Therefore, a relatively hydrophobic temporary support e.g. an unsubbed cellulose triacetate sheet, a polystyrene sheet, a polyester sheet, or sheet of copoly(vinyl acetate/vinyl chloride) and a permanent support having a hydrophilic surface, e.g. a polyethylene terephthalate support subbed for adhering gelatin coatings is used preferably, e.g. a hydrophobic support subbed as described in the Belgian patent specification 721,469. According to a preferred embodiment the photosensitive coating is composed in such a way that its adherence to the temporary support in wet state is less than in dry state. This can be attained by the addition of hygroscopic agents e.g. a water-soluble organic hygroscopic compound e.g. glycerol and the use of wetting and plasticizing agents. After wash-off treatment the colloid relief pattern is preferably dehydrated (unswelled) with a water-attracting alkanol/water mixture preferably an ethanol/water mixture in order to provide a sufficient mechanical strength and to prevent damage when transferring a further colloid layer thereon. A temporary support having a repelling power for wet gelatin coatings is, e.g., a paper base coated with a polyethylene layer, a paper base impregnated with wax, a paper base coated with a layer of cellulose nitrate or a paper base coated with a layer of insolubilised polyvinyl alcohol or a layer of alginic acid insolubilized with an alkaline earth metal salt.

The permanent support may be rigid as well as flexible and only must present by itself or by means of (a) subbing layer(s) a good adherence in wet as well as in dry state for the transferable hydrophilic colloid coating.

Depending on the use of the multicolour print the permanent support is transparent or opaque. So, it is possible to use metal layers or sheets, glass, ceramics, resin supports and paper impermeabilized for the processing and washing liquids.

For purposes such as colour proofing wherein several exposures have to be effected in register it is necessary to use a resin support with high dimensional stability.

Resin supports characterized by a high mechanical strength and very low water-absorption and consequently high dimensional stability in dry and wet state can be formed from a linear polyester, e.g. a linear polyester e.g. polyethylene terephthalate. Good results as to dimensional stability are obtained with aluminium sheets sandwiched between two high wet-strength paper sheets although this material is rather expensive.

Permanent resin supports can be made opaque by coating them with a matted subbing layer or by matting or colouring them in the mass. The matting may be effected by pigments known therefor in the art, e.g. titanium dioxide, zinc oxide, and barium sulphate. Matting can also be obtained by producing a "blush-coat" as described e.g. in Canadian patent specification 654,438.

Hydrophobic resin supports to be used as permanent support according to the present invention are coated with one or more subbing layers for a hydrophilic colloid layer.

Preferred subbing layers for use on a permanent hydrophobic resin support, e.g. a polyethylene terephthalate support, are described in the Belgian patent specification 721,469. In the said specification, which has to be read in conjunction herewith, a sheet material is claimed that successively comprises a hydrophobic film support, a layer (A), which directly adheres to the said hydrophobic film support and comprises a copolymer formed from 45 to 99.5% by weight of at least one of the chlorine-containing monomers vinylidene chloride and vinyl chloride, from 0.5 to 10% by weight of an ethylenically unsaturated hydrophilic monomer, and from 0 to 54.5% by weight of at least one other copolymerisable ethylenically unsaturated monomer; and a layer (B) comprising in a ratio of 1:5 to 1:0.5% by weight a mixture of gelatin and a copolymer of 30 to 70% by weight of butadiene with at least one copolymerisable ethylenically unsaturated monomer.

Preferably the subbed permanent film support consists of a hydrophobic film support and the combination of the two anchoring subbing layers as described above. The hydrophobic film support may be a film of cellulose triacetate, polyethylene terephthalate, polycarbonate, polystyrene, polymethacrylic acid ester, etc. The subbed hydrophobic film support may be provided on only one side or on both sides with the combination of subbing layers.

A detailed description will now be given of the composition and structure of a preferred light-sensitive material, and of its use in the production according to the present invention of a multicolour image.

A coating composition is prepared containing gelatin dissolved in water wherein (a) selected pigment(s) is (are) dispersed in a concentration to yield after coating and drying a recording layer having an optical density in the wavelength range of maximal absorption of at least 0.4. The coating composition preferably contains at least 50% by weight of gelatin in respect of the pigment particles and a proper amount of plasticizing agent and repellent (a water-attracting compound e.g. glycerol) to provide to the coating a sufficient adherence to its temporary support and to enable its easy wet (aqueous) stripping off from the temporary support, e.g. an unsubbed cellulose triacetate or polyethylene terephthalate support. In addition to said ingredients the coating composition contains (a) diazonium compound(s) in an amount high enough to allow selective hardening after exposure. The amount of said diazonium compound is, however, such that the gelification of the gelatin is not substantially affected and optimum sensitivity is attained without reaching the concentration, at which the diazonium compound starts to crystallize from the dry layer. A suitable amount of diazonium compound(s) is in the range of 15 to 40% by weight in respect of the dry gelatin.

The coating preferably contains 1 to 10 g. of gelatin per sq. m. Optimal results are obtained with 3 g. of gelatin per sq. cm.

In order to improve the keepability of the recording layer its pH is kept rather low, e.g. below 2.5. Acids suited for that purpose are citric acid, tartaric acid, trichloroacetic acid, sulphosalicylic acid, phosphoric acid, boric acid, phytic acid and naphthalene-sulphonic acid.

In order to improve the sharpness of the graphic reproduction the gelatin layer may contain a screening dye.

A second coating, the so-called top-layer, the composition of which is preferably identical to the foregoing, except that no pigment(s) is (are) present, is coated on the first one. The second coating preferably contains 0.5 to 5 g. of gelatin per sq. m. It is however, not strictly necessary to incorporate a radiation-sensitive diazonium compound in the said second coating, since a sufficient amount of said compound can diffuse during coating and drying therein from the underlying pigmented layer.

The said second coating forms with the underlying pigmented coating one hardenable double layer firmly bound together, in other words a "composite layer" which can be transferred as a whole from the temporary support to the permanent support.

A set of materials containing such a composite layer is preferably used for preparing a multicolour "colour proofing image." A usual set contains yellow, magenta, cyan, and black pigment coatings on separate cellulose triacetate supports.

The permanent support, e.g. a polyethylene terephthalate support, is successively coated with a first subbing layer on the basis of a copolymer containing hydrophobic and hydrophilic structural units in a proper ratio and a second subbing layer, which is more hydrophilic than the first one and contains gelatin, a hydrophobic latex polymer and a white pigment, e.g. titanium dioxide particles for conferring an opaque aspect to the support.

The permanent support preferably supplied in colour proofing is a hydrophobic polyester resin support subbed with a system of subbing layers as described in the Belgian patent specification 721,469. The opaque white support has an opacity and whiteness resembling as much as possible the whiteness and opacity of the printing stock whereon the actual print has to be made.

The preparation of a multicolour "colour proof" then proceeds according to a preferred embodiment as follows.

To the said permanent support subbed as described above the unexposed pigment coating is transferred by pressing the surface of the subbing layer and of the unexposed coating together in the presence of an aqueous liquid and peeling off the temporary cellulose triacetate support.

The transfer can be carried out in an apparatus, in which the materials involved are pressed together between rollers. A suitable apparatus for that purpose is described in the United Kingdom patent application 48,788/68 corresponding with the published Dutch patent application 6915595.

The said apparatus is particularly suitable for use in transferring in wet or moist state colloid layers from a temporary support to a permanent support and such apparatus comprises a pair of cooperating pressure rollers and means for driving said rollers, a first platform for supporting the permanent support prior to its engagement by said pressure rollers, said platform being formed in such a way as to make interrupted or discontinuous contact with the permanent support when this is placed thereon, a second platform arranged over and separated from the first surface for supporting at least the leading part of the temporary support to keep said temporary support separated from a permanent support when this is located on the first platform, the forward ends of both said platforms being disposed proximate to the nip of the pressure rollers so that the supports as they are advanced are gripped by said rollers and progressively pressed together.

After the transfer and drying e.g. with a hot air stream the photosensitive gelatin layer is exposed through a first halftone separation transparency, which is here a halftone positive of the original. In a particular case of four-colour printing a cyan pigment coating is first applied to the permanent support and exposed through the cyan printer halftone separation positive of the original. After the exposure the photosensitive coating is treated with moist ammonia vapour or with an aqueous liquid containing an alkaline substance. The non-hardened exposed portions are washed away selectively with a jet of tap water preferably at 30–50° C. In successive order the same steps are carried out for the yellow, magenta, and black-pigmented coating, which are exposed in register on the same support carrying already the cyan pigment coating but respectively through the yellow printer halftone, magenta printer halftone and black printer halftone positive of the original. However, the order wherein the colour relief images are made can be chosen arbitrarily.

The exposure, preferably being a vacuum frame contact-exposure, is carried out with a light-source sufficiently emitting in the ultraviolet range of the spectrum, e.g. with a carbon arc, a xenon arc, or a high pressure mercury vapour tube. The duration of the exposure does not only depend on the photosensitivity of the diazonium compound but also on the type of the pigment, more particularly on its inherent absorption of ultraviolet radiation and blue light. In order to obtain a halftone relief having an optimal dot sharpness the pigment coating is exposed while being in direct contact with the image-containing layer of the transparent original.

After the treatment in the alkaline activating bath the exposed gelatin-containing-recording-layer-portions are preferably washed off without mechanical rubbing by means of running water at a temperature preferably between 30 and 50° C. The relief image, which has absorbed an amount of water is then preferably dehydrated (unswelled) in a dehydrating liquid e.g. an alcoholic liquid containing 70 to 30% by volume of water and 30 to 70% by volume of ethanol. Excess of liquid is preferably removed by squeezing the relief between two smooth soft rollers e.g. rubber rollers.

The permanent support carrying the first relief image (the cyan relief image) is pressed between the same rollers while in contact with another pigment coating, e.g. the yellow pigment coating, and after a few seconds of contact the temporary support is peeled off, thus overall transferring the yellow pigment coating on the cyan part image produced already. The said yellow pigment coating is dried before contact exposure. Drying proceeds e.g. with a warm air current of 40° C.

The whole procedure of exposure (exposure in register), activating treatment, washing-off, and dehydration is repeated for the yellow coating and the same applied for the magenta printer image and black printer image.

According to a special embodiment the activating treatment and washing off proceeds with or in one and same liquid.

The obtained colloid pattern or multilayer colloid pattern can be protected and given a glossy appearance by a transparent resin top-coat, which according to a preferred embodiment is applied by spraying. A suitable "spray-cover" consists of polyisobutyl methacrylate.

The production of a multicolour proof is illustrated in more details in the following examples, without however limiting the invention thereto.

The percentages are by weight if not otherwise stated.

EXAMPLE 1

(I) Preparation of the photosensitive coatings (A) Cyan coloured photosensitive coating.—The following ingredients were mixed with each other at a temperature of 50° C.

| | |
|---|---|
| 14.6% aqueous gelatin solution | 240 grams. |
| 10% aqueous solution of a wetting agent of the following formula— 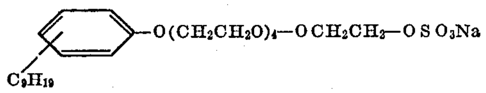 | 4.5 milliliters. |
| Heliogenblau B Colanyl Teig (a cyan pigment dispersion marketed by Badische Anilin- & Soda-Fabrik A.G., Ludwigshafen/Rh., W. Germany). | 2.5 grams. |
| combined with a 10% aqueous solution of 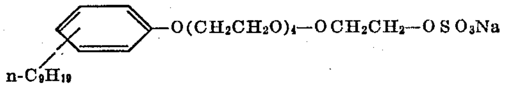 | 9 milliliters. |
| A mixture of glycerine-water (1:9 by weight) | 32.5milliliters. |
| 20% aqueous solution of citric acid | 20 milliliters. |
| 5% solution in water of the mixture of 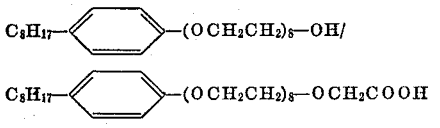 (17/83% by weight). | 5.25 milliliters. |
| 11.7% by weight solution of saponine in a mixture of ethanol-water (1:4 by weight). | 5 milliliters. |
| p-Diazo-2,5-dimethoxy-1-morpholinobenzene chloride·zinc chloride | 10 grams. |
| Water | 136 milliliters. |
| Water to make | 500 milliliters. |

This mixture was coated at a ratio of 45 g./m.² and at a temperature of 35° C. onto an unsubbed cellulose triacetate film being 0.10 mm. thick and serving as a temporary support.

(B) Yellow coloured photosensitive coating.—The composition and preparation of the yellow pigment coating is the same as for the cyan pigment coating under (A) except for the use instead of the cyan pigment of 4 g. of a yellow pigment dispersion marketed by Hoechst A. G. under the trade name Imperon Gelb K–GG.

(C) Magenta coloured photosensitive coating.—The composition and preparation of the magenta pigment coating is the same as for the cyan pigment coating under (A) except for the fact that instead of the cyan pigment dispersion 5 g. of a magenta pigment dispersion containing 10 parts by weight of: Litholscharlach BBM Pigmosol (a magenta pigment dispersion marketed by Badische Anilin- & Soda-Fabrik—Ludwigshafen (Rhine), Germany were used.

(D) Black coloured photosensitive coating.—The composition and preparation of the black pigment coating are the same as for the cyan pigment coating under (A) except that now 0.4 g. of the described cyan pigment dispersion are used in admixture with 5.4 g. of a carbon black dispersion marketed under the trade name Russdispersion P 130 by Degussa—Frankfurt (M), W. Germany.

(II) Preparation of the permanent support

A biaxially stretched polyethylene terephthalate film having a thickness of 180μ was subbed at both sides by the following composition at 25–30° C. at a ratio of 1.6 g./sq. m.:

copolymer of vinylidene chloride, N - tert. - butylacrylamide, n-butyl acrylate, and N-vinylpyrrolidone (ratios by weight 70:23:3:4)—5.5 g.
methylene chloride—65 ml.
1,2-dichloroethane—35 ml.

The resulting layer was coated with a mixture prepared as follows:

1350 g. of titanium dioxide (average particle size: 0.11μ) were dispersed in 5 l. of water containing 25 ml. of Dequest 2006 (trade name of Monsanto Chemical Company, St. Louis, Mo., U.S.A. for a dispersing agent corresponding to the following structural formula:

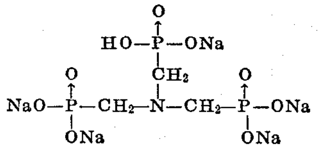

The dispersion was stirred rapidly for 10 min. at a temperature of 5 to 15° C. and then heated to 35° C., at which temperature 400 ml. of a 10% by weight aqueous solution of gelatin was added, while continuing the rapid stirring. Subsequently the following composition was added by stirring slowly to avoid scumming:

| | Ml. |
|---|---|
| A 10% by weight aqueous solution of gelatin | 1800 |
| Water | 130 |
| 20% by weight latex (aqueous dispersion) of the copolymer of butadiene and methyl methacrylate (ratio by weight 50:50) | 2500 |
| 10% by weight aqueous solution of the sodium salt of oleylmethyltauride | 37.5 |
| Ethylene chlorohydrin | 500 |

The coating was carried out at such a rate that upon drying a layer of 5μ was obtained.

(III) Processing

The permanent support was for 1½ minutes imbibed in an ethanol-water mixture. The volume ratio of ethanol and water was between 1 and 6:1 but preferably between 2:1.

The cyan pigment coating on its temporary support the pressed in wet state between soft rollers in contact with the described wetted permanent support. After a contact time of 30 sec. the temporary support was stripped off, thus leaving the cyan pigment coating fixed on the permanent support. The transferred coating was air-dried and put in a vacuum frame in contact with the cyan printer separation halftone positive of a multicolour original to be printed.

The pigment coating was exposed for 3 min. with a carbon arc light source (1×40 amp.) placed at a distance of 70 cm.

The exposed pigment coating was dipped for 180 sec. in a tray containing the following alkaline activating composition:

| | Ml. |
|---|---|
| Triethanolamine | 250 |
| Water | 250 |
| Isopropanol | 2000 |

Gaseous ammonia till saturation.

The relief was developed by washing without rubbing in running water having a temperature of 35° C. Subsequently, the relief image was dipped for 1 min. in a mixture of ethanol and water (70:30% by volume).

In the same way as described for the cyan pigment coating the yellow, magenta and black pigment coatings were transferred onto the already formed relief image and each exposure carried out in register through the proper halftone selection positives. The exposure times were adapted to the sensitivity of the differently pigmented recording layers.

The obtained multicolour image built up of superposed cyan, yellow, magenta and black relief images serves as proof for the printer to judge of the quality of the cyan, yellow, magenta and black printer halftone selection positives.

EXAMPLE 2

Example 1 was repeated but each pigment coating after coating on its temporary support was covered with an antistress layer applied from the following composition at a ratio of 33 g./sq.m.

Gelatin—135 g.
A 10% aqueous dispersion of silica particles (average particle size 2–3$\mu$) in a 8% aqueous gelatin solution—30 g.
11.7% solution of saponine in a mixture of ethanol-water (1:4 by weight)—20 ml.
Tergitol 4 (trade name for 7-ethyl-2-methyl-4-undecanol ester of sodium bisulphate marketed by Union Carbide and Carbon, New York, U.S.A.)—15 ml.
Water till 1000 g.

EXAMPLE 3

Example 2 was repeated but to the antistress layer coating composition 40 ml. of a 20% by weight aqueous solution of citric acid and 100 ml. of water were added before bringing the weight up to 1000 g.

EXAMPLE 4

Example 2 was repeated but before bringing the coating composition of the antistress layer up to 1000 g., following mixture was added:

20% aqueous solution of citric acid—40 ml.
p-diazo - 2,5 - dimethoxy-1-morpholino-benzene chloride. zinc chloride—10 g.
Water—150 ml.

EXAMPLE 5

The recording materials applied were the same as those of Example 4.

In order to obtain a multicolour image the procedure of Example 1 was followed with the difference, however, that the alkaline activating treatment was carried out now with warm, moist ammonia vapour generated in a diazo apparatus "Actina S" (trade name for a diazo copying apparatus of Regma N.V., Brussels, Belgium). The treatment lasted 10 seconds.

The final multicolour image obtained that way possessed a brownish background colouration (stain), which was removed by dipping it for 2 minutes in a decolouration bath of the following composition:

Sodium hydrosulphite ($Na_2S_2O_4$)—100 g.
Water to make 1000 ml.

EXAMPLE 6

The procedure of Example 5 was repeated with the difference, however that after the colour development of each monocolour image the background stain was removed. The monocolour relief image made more bright that way was washed in water before dipping it in the ethanol-water mixture and receiving the next coloured colloid layer.

EXAMPLE 7

Example 5 was repeated, but as decolouration bath the following composition was used:

| | G. |
|---|---|
| Stannous chloride.2 water | 100 |
| Citric acid | 50 |

Water to make 1000 ml.

EXAMPLE 8

Example 5 was repeated but as decolouration bath the following composition was used:

Hypophosphorous acid ($H_3PO_2$)—200 g.
Water to make 1000 ml.

EXAMPLE 9

Example 4 was repeated but as activating liquid the following composition was used:

| | Ml. |
|---|---|
| Methanol | 100 |
| Concentrated aqueous ammonia | 100 |
| Isopropanol | 800 |

The activating treatment was effected in said bath at a temperature of 35 to 55° C. and for a duration of 2 to 5 minutes.

The selective wash-off treatment was carried out with running water at 35° C.

EXAMPLE 10

Example 9 was repeated with the difference, however, that the p-diazo-2,5-dimethoxy - 1 - morpholino-benzene chloride.zinc chloride was replaced by a same amount of 4 - (dimethylamino) - phenyldiazonium chloride.zinc chloride.

EXAMPLE 11

Example 9 was repeated with the difference, however, that the p-diazo-2,5-dimethoxy - 1 - morpholino-benzene chloride.zinc chloride was replaced by a same amount of p-[ethyl - (2 - hydroxyethyl)-amino]-benzene diazonium chloride.½ zinc chloride.

EXAMPLE 12

A polyester film, suitable for writing on with ink or pencil, a so-called drafting film consisting of a polyethylene terephthalate support double side coated with a semitransparent layer on the basis of titanium dioxide dispersed in hardened gelatin containing a latex polymer such as a copolymer of vinyl chloride, vinylidene chloride, n-butyl acrylate and itaconic acid (63:30:5:2 mole percent) was used as permanent support for coating thereon at a ratio of 45 g. per sq. m. a black photosensitive layer from the following composition.

| | |
|---|---|
| A 14.5% aqueous solution of gelatin | 240 grams. |
| For wetting purposes a 10% aqueous solution of the wetting agent 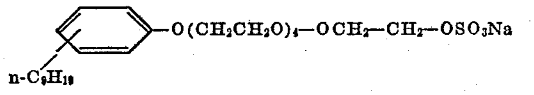 | 4.5 milliliters. |
| A carbon black dispersion marketed under the trade name Russdispersion P 130 by Degussa, Frankfurt (M), W. Germany. | 5.4 grams. |
| Heliogenblau B Colanyl Teig (a cyan pigment dispersion marketed by Badische Anilin- & Soda-Fabrik A. G. Ludwigshafen/Rh., W. Germany). combined with a | 0.4 gram. |
| 10% aqueous solution of the above cited wetting agent | 9 milliliters. |
| A glycerine-water mixture (1:9) | 63 milliliters. |
| A 20% aqueous solution of citric acid | 20 milliliters |
| 4-(N-hydroxyethyl-N-ethylamino)-phenyl diazonium chloride-zinc chloride. | 10 grams. |
| Water | 136 milliliters. |

The coated layer was dried at a temperature of 20–30° C.

The dried photosensitive recording layer was exposed in direct contact with a tracing paper comprising a drawing of a machine part in black ink. The exposure was carried out for 10 sec. with a 1000 watt ultra-violet light bulb placed at a distance of 10 cm. from the photosensitive coating.

After exposure the recording layer was treated with moist ammonia vapour. A positive black image on a semitransparent support was obtained by washing-off with running water of 35–37° C.

Instead of using in the exposure the said ultraviolet light bulb a flash lamp emitting in the ultra-violet range can be used e.g. a flash lamp operating with 4 kv. The wash-off processing following the treatment with ammonia vapour yields the same result.

Other suitable drafting films that can be used as support for the photosensitive hydrophilic colloid layers applied according to the present invention are described in the Dutch patent application 7001115 corresponding with the United Kingdom patent application 7391/69. These films behave like tracing paper e.g. allow a drawing or pattern to be retouched and are written on easily with pencil and ink.

EXAMPLE 13

Example 12 was repeated except for the fact that the photosensitive coating was applied from a following coating composition:

10% aqueous gelatin solution—140 ml.
15% aqueous carbon black dispersion containing 2% of poly(N-vinylpyrrolidone)—40 ml.
5% aqueous solution of the wetting agent Tergitol 4 (trade name for 7-ethyl-2-methyl-4-undecanol ester of sodium bisulphate marketed by Union Carbide and Carbon, New York, U.S.A.)—10 ml.
Citric acid—2 g.
4-(N-diethylamino)-phenyldiazonium chloride.zinc chloride—5 g.
Water—105 ml.

We claim:

1. A process for the production of a colored colloid relief pattern comprising the steps of (1) imagewise exposing to active electromagnetic radiation a colored water-soluble hydrophilic colloid layer which is capable of undergoing hardening by reaction with an alkaline compound and contains about 15–45% by weight of the dry colloid of a diazonium compound decomposable on exposure to said radiation, (2) contacting the exposed layer uniformly with an alkaline compound, and (3) thereafter subjecting the layer to washing with an aqueous liquid, whereby the exposed portions of said colloid layer are removed, leaving the unexposed areas intact to form said relief pattern as a consequence of the selective hardening action of said alkaline compound for the areas of said colloid layer containing undecomposed diazonium compound.

2. A process according to claim 1, wherein the colloid layer contains a dye and/or pigment.

3. The process of claim 1 wherein said alkaline compound is applied in sufficient amount to impart to the colloid layer a pH of above about 8.

4. The process of claim 3 wherein said alkaline compound is an inorganic base or an organic onium hydroxide.

5. The process of claim 3 wherein said alkaline compound is ammonia vapor or an organic amino compound 6. The process of claim 3 wherein said exposing radiation contains ultraviolet light.

7. A process according to claim 1, wherein the hardenable colloid layer contains gelatin and the wash-off treatment is effected without mechanical rubbing by means of running water having a temperature between 30 and 50° C.

8. A process for the production of a monocolour colloid relief pattern according to claim 1, wherein the hydrophilic colloid layer is carried on a transparent temporary support.

9. A process for the production of a monocolour colloid relief pattern according to claim 1, wherein the hydrophilic colloid layer is carried on a drafting film serving as the temporary support.

10. A process of producing a colored colloid relief pattern from at least one colored colloid layer consisting essentially of a water-soluble hydrophilic colloid binder containing colorant material and about 15–45% by weight of dry colloid binder of a diazonium compound undergoing decomposition when exposed to active electromagnetic radiation, said hydrophilic binder being normally adapted to undergo hardening to a water-insoluble condition upon reaction with an alkaline compound in the presence of undecomposed diazonium compound, which comprises the steps of:

(1) bringing a relatively hydrophobic temporary support carrying one such colored colloid layer into contact under pressure with a permanent support at least damp with an aqueous liquid and separating said supports to transfer said colloid layer in entirety to said permanent support,
(2) drying the transferred colloid layer,
(3) exposing the dry colloid layer imagewise to active electromagnetic radiation to decompose the diazonium compound in the exposed areas of said layer,
(4) contacting the thus exposed colloid layer in the presence of water with an alkaline compound to harden the hydrophilic binder thereof in the unexposed areas of the layer while the exposed areas remain in water-soluble condition, and
(5) washing the differentially hardened colloid layer with an aqueous liquid to remove the exposed and unhardened areas thereof, leaving the unexposed hardened areas intact as a colored relief image on said permanent support.

11. The process of claim 10 wherein said exposing radiation contains ultraviolet light.

12. A process according to claim 10, wherein the alkaline compound raises the pH of the hydrophilic colloid layer above about 8.

13. A process according to claim 10, wherein the alkaline compound is an inorganic base or an organic onium hydroxide.

14. A process according to claim 12, wherein the alkaline compound is ammonia vapour or an organic amino compound.

15. A process according to claim 10, wherein the alkaline compound is applied as a solution in water or in a mixture of water and a water-miscible solvent.

16. A process according to claim 10, wherein each such colored hardenable colloid layer on its temporary support is covered with a substantially uncolored top layer containing the same colloid as the colored colloid layer therebeneath.

17. A process according to claim 10, wherein the coloured hardenable colloid layer has a thickness in the range of 1$\mu$ to 15$\mu$.

18. A process according to claim 10, wherein each such colored colloid layer contains a pigment that is dispersible in water.

19. A process according to claim 10, wherein each such colloid layer contains a water-soluble hydrophilic hardenable colloid that possesses the property of sol-gel transformation.

20. A process according to claim 19, wherein the colloid layer comprises gelatin.

21. A process according to claim 10, wherein the colloid layer contains a diazonium compound derived from 1,2- and 2,1- amino-naphthols, 1,4-amino naphthols or aromatic p-diamines of the benzene series.

22. A process according to claim 10, wherein the temporary support is an unsubbed cellulose triacetate film sheet.

23. A process according to claim 10, wherein the permanent support is a hydrophobic resin support subbed with a surface layer having hydrophilic properties.

24. A process according to claim 23, wherein said permanent support comprises a hydrophobic film support having superposed thereon in succession a layer (A), which directly adheres to said hydrophobic film support and comprises a copolymer formed from 45 to 99.5% by weight of at least one of the chlorine-containing monomers vinylidene chloride and vinyl chloride, from 0.5 to 10% by weight of an ethylenically unsaturated hydrophilic monomer, and from 0 to 54.5% by weight of at least one other copolymerisable ethylenically unsaturated monomer, and a layer (B) comprising in a ratio of 1:3 to 1:0.5 by weight a mixture of gelatin and a copolymer of 30 to 70% by weight of butadiene with at least one copolymerisable ethylenically unsaturated monomer.

25. A process according to claim 10, wherein after said washing step the colloid relief pattern is subjected to a dehydration treatment with a mixture of a water-attracting alkanol and water.

26. A process according to claim 25, wherein the dehydration is carried out with a liquid containing 70 to 30% by volume of water and 30 to 70% by volume of ethanol.

References Cited

UNITED STATES PATENTS

| | | | |
|---|---|---|---|
| 3,110,592 | 11/1963 | Scherwin et al. | 96—91 |
| 3,138,460 | 6/1964 | Levinos | 96—49 |
| 1,926,620 | 9/1933 | Herzog | 96—15 |
| 1,972,311 | 9/1934 | Nicoll | 96—15 |
| 2,050,552 | 8/1936 | Baker | 96—15 |
| 2,327,304 | 8/1943 | Grant | 96—15 |

NORMAN G. TORCHIN, Primary Examiner

E. C. KIMLIN, Assistant Examiner

U.S. Cl. X.R.

96—15, 83, 87, 89, 91